United States Patent [19]

Shimada et al.

[11] Patent Number: 5,140,601
[45] Date of Patent: Aug. 18, 1992

[54] OUTPUT CONTROL APPARATUS OF LASER UNIT AND ADJUSTING METHOD THEREOF

[75] Inventors: Kazuyuki Shimada, Chofu; Chiaki Taniguchi, Kawasaki, both of Japan

[73] Assignee: Ricoh Company, Ltd., Tokyo, Japan

[21] Appl. No.: 714,657

[22] Filed: Jun. 13, 1991

[30] Foreign Application Priority Data

Jun. 16, 1990 [JP] Japan .................. 2-158336
Aug. 6, 1990 [JP] Japan .................. 2-206701
Apr. 11, 1991 [JP] Japan .................. 3-106908

[51] Int. Cl.$^5$ .............................................. H01S 3/13
[52] U.S. Cl. ........................................ 372/29; 372/38
[58] Field of Search ............................ 372/29, 25, 38; 371/30-32

[56] References Cited

U.S. PATENT DOCUMENTS

4,856,008 8/1989 Senma et al. .................. 372/31
4,926,433 5/1990 Imamura et al. .................. 372/38

FOREIGN PATENT DOCUMENTS

174794A 6/1986 Japan .

Primary Examiner—Léon Scott, Jr.
Attorney, Agent, or Firm—Cooper & Dunham

[57] ABSTRACT

An output control apparatus for controlling emission power of a laser unit includes: a monitor circuit for generating a first monitor signal corresponding to the emission power of the laser unit; a monitor signal amplifier for amplifying the first monitor signal and for outputting a second monitor signal, the monitor signal amplifier having a trimable resistor for adjusting a gain; and a control circuit for controlling the emission power of the laser unit based on the second monitor means so that the emission power of the laser unit is maintained at a predetermined power level. A method for adjusting the above output control apparatus includes the following steps (a) and (b) of: (a) maintaining the emission power of the laser unit at a predetermined power level; and (b) carrying out a trimming of the trimable resistor so that the second monitor signal becomes a predetermined value while the step (a) is being carried out. Thus, the gain of the monitor signal amplifier is adjusted so that the emission power having the predetermined power level is obtained when the second monitor signal is equal to the predetermined value.

6 Claims, 7 Drawing Sheets

OUTPUT CONTROL APPARATUS OF LASER UNIT AND ADJUSTING METHOD THEREOF

BACKGROUND OF THE INVENTION

The present invention generally relates to an output control apparatus of a laser unit and an adjusting method thereof, and more particularly to an output control apparatus of a laser unit and an adjusting method thereof which are used for a laser printer and the like.

A light source unit used in a laser printer is disclosed, for example, in Japanese Patent Laid Open Publication No. 61-174794. The light source is a so-called semiconductor laser unit. In this semiconductor laser unit, a semiconductor laser element is mounted together with a collimator lens in a housing. A laser beam having a divergent bundle of rays which is emitted from the semiconductor laser element is converted into a laser beam having a parallel bundle of rays by the collimator lens. Then the laser beam passing through the collimator lens is emitted from the housing of the semiconductor laser unit. The laser beam from the semiconductor laser unit is supplied to a scanner and a focusing system so as to scan a photosensitive drum. Thus, an image is formed on the photosensitive drum in accordance with an electrostatic recording procedure.

Figure 1:
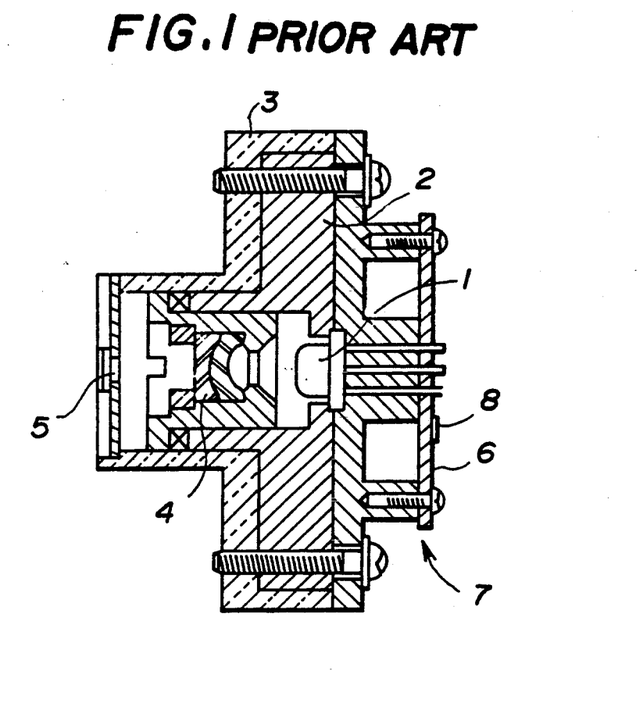
FIG. 1 is a sectional view illustrating an example of a semiconductor laser unit.

An example of a structure of the semiconductor laser unit is shown in FIG. 1. Referring to FIG. 1, a semiconductor laser element 1, a monitor photodiode (not shown) and a collimator lens 4 are mounted in a housing which is formed of a metal base plate 2 and an insulator 3. The monitor photodiode is, for example, formed of a pin photodiode. A print circuit board 6 (PCB) is fixed on a rear end surface of the housing. The semiconductor laser element 1, the monitor photodiode, a monitor signal amplifier 8 and other electric components are electrically connected to the print circuit board 6. An aperture 5 for shaping a spot of a laser beam is formed on the front end surface of the housing. In the semiconductor laser unit 7 having the above structure, the semiconductor laser element 1 emits a first beam which travels toward the front end surface of the housing and a second beam which travels toward the monitor photodiode. The first beam is referred to as a front beam (FB) and the second beam is referred to as a back beam (BB).

The semiconductor laser unit is detachably mounted in the laser printer. In a case where the semiconductor laser unit is used in the laser printer, emission power which corresponds to the amount of light emitted from the semiconductor laser unit 7 has to be controlled at a standard power level which is required for exposing the photosensitive drum in the laser printer. Thus, a feed back loop control circuit shown in FIG. 2 controls the emission power of the semiconductor laser unit 7 at the standard power level.

Figure 2:
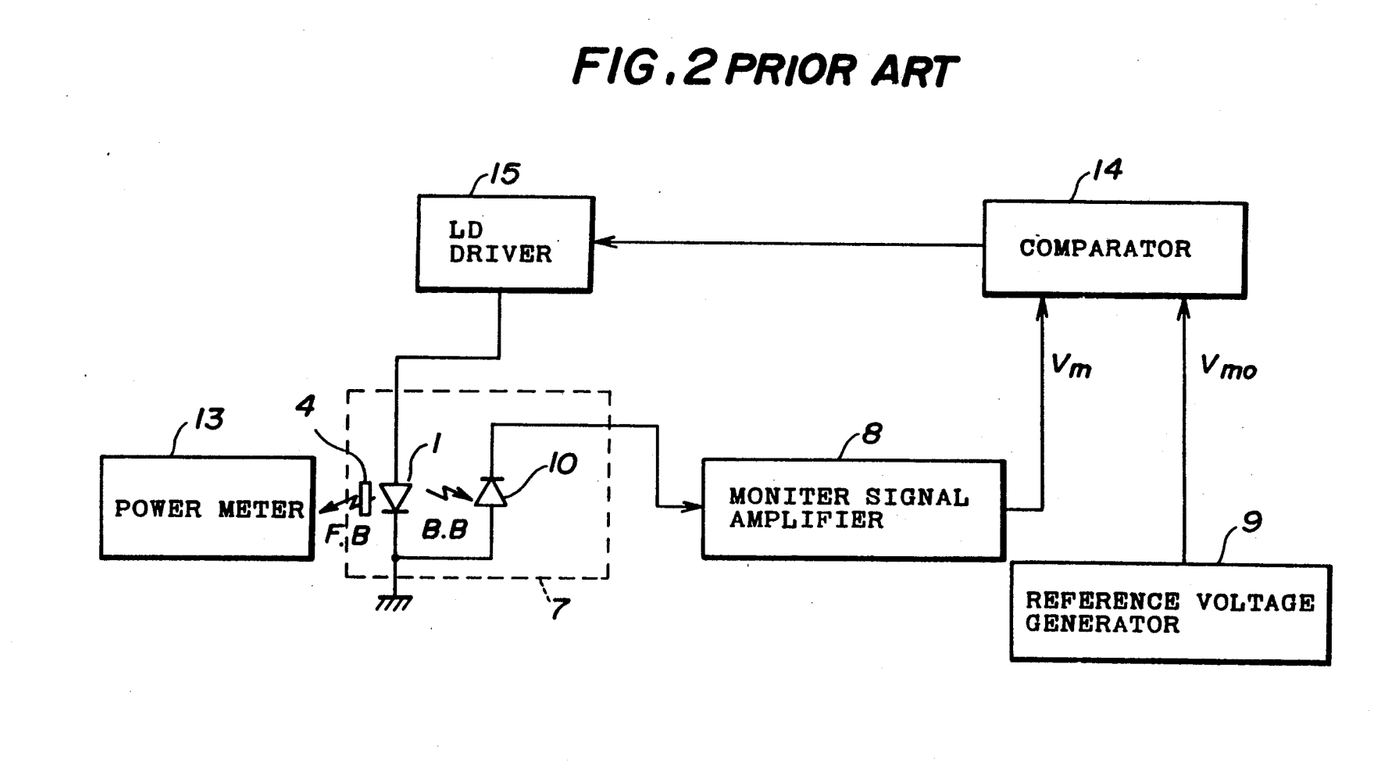
FIG. 2 is a block diagram illustrating a conventional apparatus for adjusting emission power of the semiconductor laser unit.

Referring to FIG. 2, the back beam (BB) emitted from the semiconductor laser element 1 is incident on the monitor photodiode 10. The monitor photodiode 10 outputs a monitor current corresponding to the amount of incident light. The monitor signal amplifier 8 converts the monitor current supplied from the monitor photodiode 10 into a monitor voltage $V_m$. The monitor voltage $V_m$ and a reference voltage $V_{mo}$ output from a reference voltage generator 9 are supplied to a comparator 14. The comparator 14 outputs a control signal corresponding to a difference between the monitor voltage $V^m$ and the reference voltage $V^{mo}$. An LD driver 15 controls a driving current of the semiconductor laser element 1 based on the control signal supplied from the comparator 14 so that the monitor voltage $V_m$ becomes equal to the reference voltage $V^{mo}$.

In the above controlling of the emission power of the semiconductor laser unit 7, there is the following problem.

A divergent angle of the laser beam emitted from the semiconductor laser element 1, an arrangement position and sensitivity of the monitor photodiode 10, a transmittance of the collimator lens 4 and the like respectively varies among a plurality of semiconductor laser units. As a result, a relationship between the monitor voltage $V^m$ and the emission power of the semiconductor laser element 1 varies among the plurality of semiconductor laser units. In this case, even if the semiconductor laser element 1 in each semiconductor laser unit is driven based on a constant driving signal, the amount of light projected onto the surface of the photosensitive drum varies among a plurality of laser printers each having the semiconductor laser unit.

Thus, in the conventional semiconductor laser unit, a gain of the monitor signal amplifier 8 is adjusted in accordance with the following procedure.

The emission power regarding the front beam (FB) emitted from the semiconductor laser element 1 is measured by a power meter 13 on the surface of the photosensitive drum. The driving current output from the LD driving circuit 15 is adjusted in accordance with the emission power measured by the power meter 13. Then, in a case where the emission power is equal to the standard power level, the gain of the monitor signal amplifier 8 is controlled so that the monitor voltage $V^m$ is equal to the reference voltage $V^{mo}$.

Figure 3:
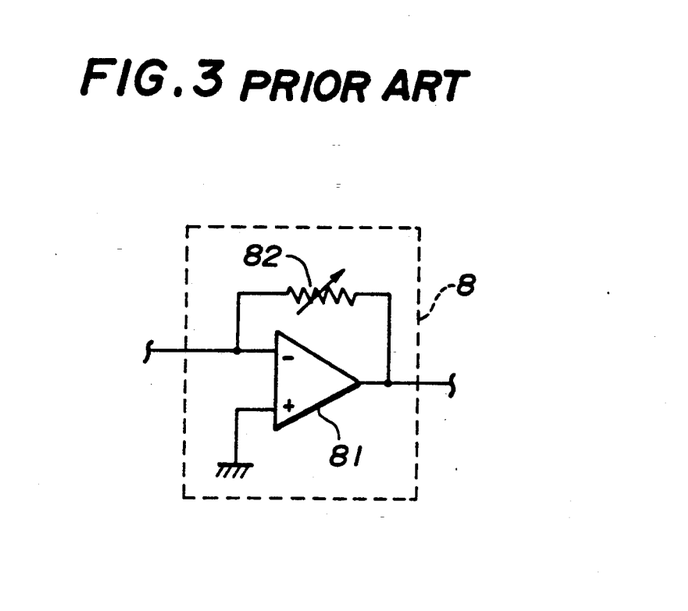
FIG. 3 is a circuit diagram illustrating a monitor signal amplifier shown in FIG. 2.

The monitor signal amplifier 8 has, for example, an operational amplifier 81 and a feed back circuit including a variable resistor 82, shown in FIG. 3. For example, a type of resistor in which an adjusting shaft has to be rotated a large number of times to vary the resistance thereof is used as the variable resistor 82. The variable resistor 82 can also be formed of a first resistor which roughly controls the resistance thereof and a second resistor which finely controls the resistance thereof.

However, in the conventional adjusting of the gain of the monitor signal amplifier, the adjusting shaft of the variable resistor has to be rotated. Thus, after the adjustment is completed, the adjusting shaft has to be locked so as to prevent the adjusting shaft from being rotated by vibrations. In this case, it is difficult to automatically adjust the resistance. In addition, in a case where two variable resistors (the above first and second variable resistors) have to be adjusted, the cost of manufacturing the semiconductor laser unit increases, and the time required for adjusting the emission power of the semiconductor laser unit also increases.

SUMMARY OF THE INVENTION

Accordingly, a general object of the present invention is to provide a novel and useful output control apparatus of a laser unit and an adjusting method thereof in which the disadvantages of the aforementioned prior art are eliminated.

A more specific object of the present invention is to provide an output control apparatus and an adjusting method thereof in which the output power of the laser unit can be accurately adjusted within a short time.

Another object of the present invention is to provide an output control apparatus and an adjusting method thereof in which the output power of the laser unit can be accurately adjusted without increasing the cost thereof.

A further object of the present invention is to provide an output control apparatus and an adjusting method thereof in which the output power of the laser unit can be automatically adjusted.

The above objects of the present invention are achieved by an output control apparatus for controlling emission power of a laser unit which emits a laser beam, the emission power corresponding to an amount of light in the laser beam emitted by the laser unit, the output control apparatus comprising: monitor means, coupled to the laser unit, for generating a first monitor signal corresponding to the emission power of the laser unit; signal processing means, coupled to the monitor means, for amplifying the first monitor signal and for outputting a second monitor signal, the signal processing means having a trimable resistor for adjusting a gain of the signal processing means, a resistance value of the trimable resistor being changed by a trimming thereof; and control means, coupled to the laser unit and the signal processing means, for controlling the emission power of the laser unit based on the second monitor means so that the emission power of the laser unit is maintained at a predetermined power level.

The above objects of the present invention are also achieved by a method for adjusting the above output control apparatus for controlling the emission power of the laser unit which emits the laser beam, the method comprising the following steps (a) and (b) of: (a) maintaining the emission power of the laser unit at a predetermined power level; and (b) carrying out a trimming of the trimable resistor so that the second monitor signal output from the signal processing means becomes a predetermined value while the step (a) is being carried out, whereby the gain of the signal processing means is adjusted so that the emission power having the predetermined power level is obtained when the second monitor signal output from the signal processing means is equal to the predetermined value.

Additional objects, features and advantages of the present invention will become apparent from the following detailed description when read in conjunction with the accompanying drawings.

DESCRIPTION OF THE PREFERRED EMBODIMENTS

A description will now be given of a first embodiment of the present invention with reference to the accompanying drawings.

Figure 4:
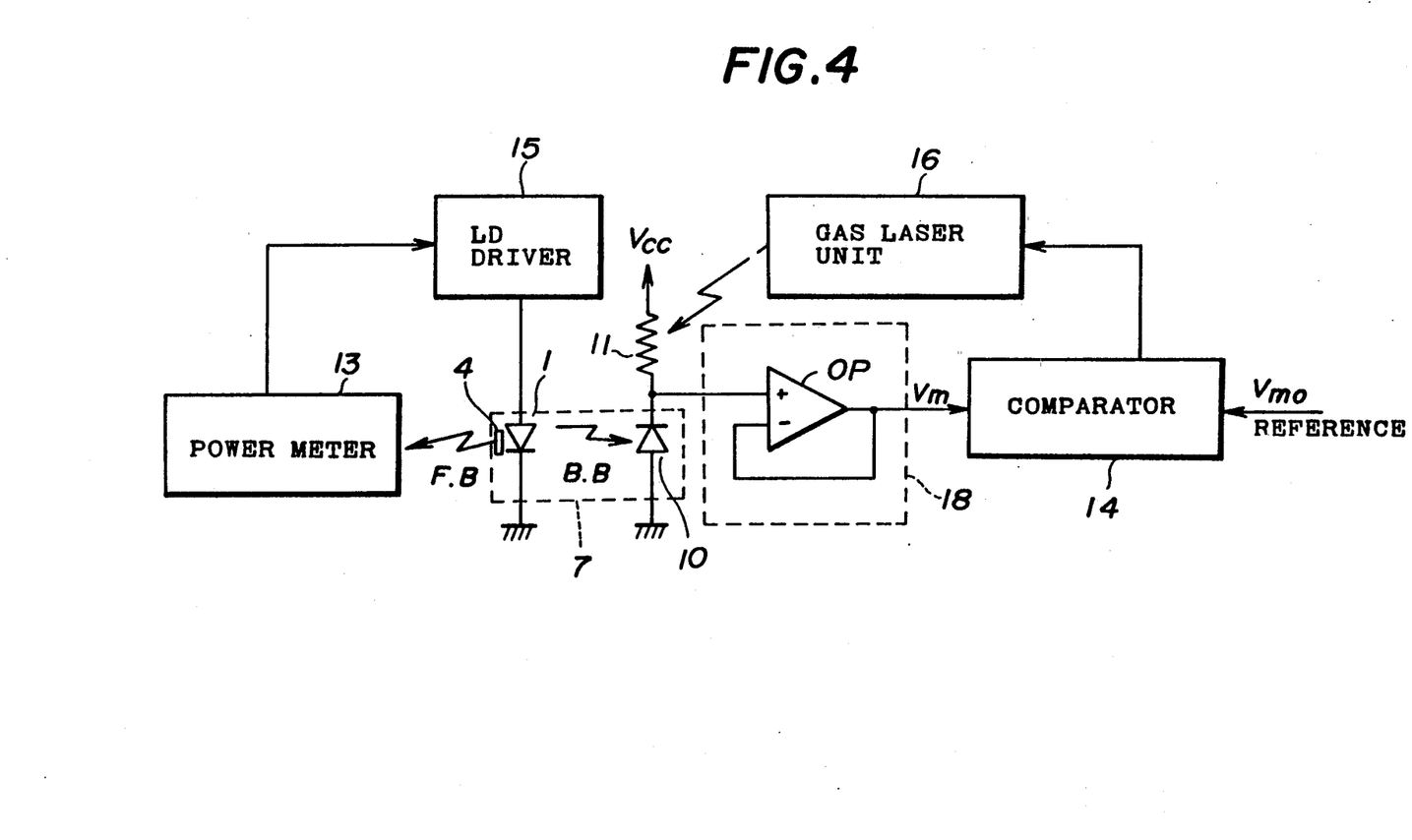
FIG. 4 is a block diagram illustrating a first embodiment of the present invention.

FIG. 4 shows an adjusting system for adjusting emission power of a semiconductor laser unit. In FIG. 4, those parts which are the same as those shown in FIG. 2 are given the same reference numbers.

Referring to FIG. 4, the adjusting system comprises a monitor signal amplifier 18, a comparator 14, a gas laser unit 16, an LD driving circuit 15 and a power meter 13. The monitor signal amplifier 18 has an operational amplifier (OP) which is constructed so as to be a voltage follower. An optical current output from the monitor photodiode 10 in the semiconductor laser unit 7 is supplied to a non-inverting terminal (+) of the operational amplifier (OP). The non-inverting terminal (+) of the operational amplifier (OP) is connected via a trimable resistor 11 to a power source $V_{cc}$. The trimable resistor 11 is formed of a thick-film resistor. The trimable resistor 11 has a resistance layer which can be trimmed so as to have a predetermined resistance value, as will be described later. The comparator 14 outputs a control signal corresponding to a difference between the monitor voltage $V_m$ output from the monitor signal amplifier 18 and the reference voltage $V^{mo}$. The gas laser unit 16 is controlled based on the control signal output from the comparator 14. The trimming of the trimable resister 11 is carried out by a laser beam emitted from the gas laser unit 16.

In a case where the semiconductor laser unit 7 is driven to print an image, the power meter 13 and the gas laser unit 16 are respectively deleted from the adjusting system shown in FIG. 4. That is, the comparator 14 is connected to the LD driving circuit 15 so that the feed back control loop is formed in the same manner as that shown in FIG. 2. The LD driving circuit 15 controls the driving current of the semiconductor laser element 1 based on the control signal so that the emission power of the semiconductor laser element 1 becomes equal to the standard power level.

Figure 7:
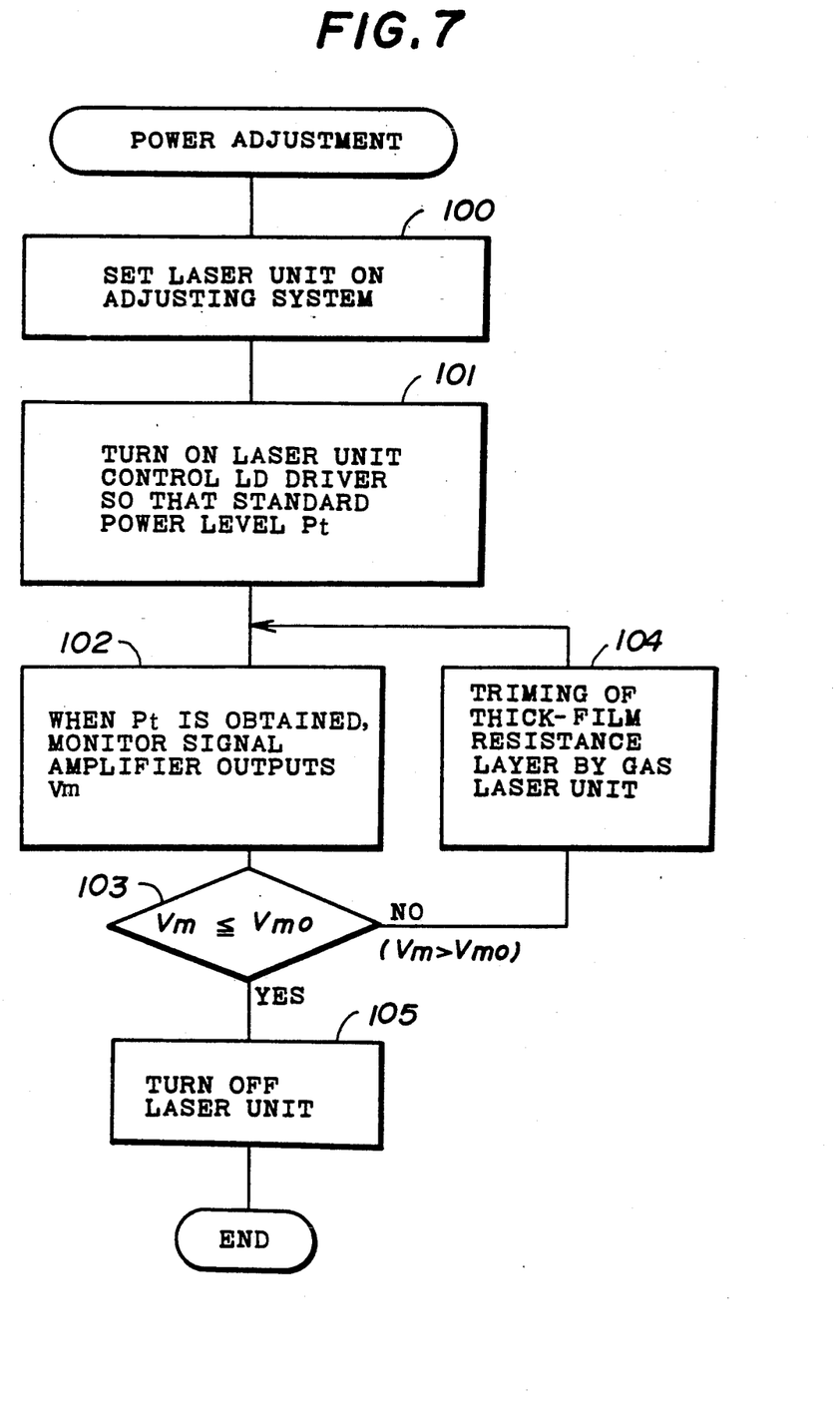
FIG. 7 is a flow chart illustrating a process for adjusting a gain of the monitor signal amplifier.

Before the semiconductor laser unit 7 is driven to print an image, a power adjustment process is carried out in accordance with a flow chart shown in FIG. 7.

Referring to FIG. 7, the semiconductor laser unit 7 is set in the adjustment system as shown in FIG. 4 (in step 100). The LD driving circuit 15 drives the semiconductor laser element 1 so that the front beam (FB) passes through the collimator lens 4 and the aperture 5. Then, the front beam (FB) emitted from the semiconductor laser unit 7 is incident on the power meter 13. The LD driving circuit 15 controls the driving current supplied to the semiconductor element 1 so that the emission power indicated by the power meter 13 becomes equal to the standard power level $P_o$ (in step 101). When the power meter 13 indicates that the emission power regarding the front beam (FB) has become equal to the standard power level $P_o$, the monitor signal amplifier 18 outputs the monitor voltage $V^m$ (in step 102). Then, step 103 determines whether or not the monitor voltage $V_m$ is less than or equal to the reference voltage $V^{mo}$. When the result obtained in step 103 is NO ($V_m > V_{mo}$), the gas laser unit 16 is driven based on the control signal corresponding to the difference between $V^m$ and $V^{mo}$. The trimming of the thick-film resistance layer in the trimable resistor 11 is continuously carried out by the laser beam emitted from the gas laser unit 16 (in step 104), so that the resistance value of the trimable resistor 11 increases.

Thus, the gain of a circuit including the monitor signal amplifier 18, the trimable resistor 11 and the monitor semiconductor laser 10 continuously decreases, so that the monitor voltage $V_m$ decreases. As a consequence, when the result obtained in step 103 is YES ($V_m \leq V_{mo}$), the semiconductor laser element 1 is turned off (in step 105).

According to the above first embodiment, as the trimming of the thick-film resistance layer in the trimable resistor 11 is carried out by the laser beam emitted from the gas laser so that the gain of the monitor signal amplifier 18 is adjusted, the emission power of the semiconductor laser element 1 can be easily adjusted in a short time. In addition, the emission power of the semiconductor laser element 1 can be automatically adjusted.

Figure 5:
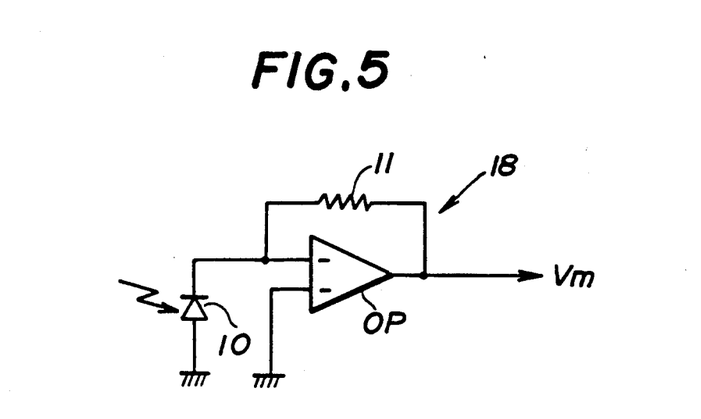
FIGS. 5 and 6 are circuit diagrams illustrating a monitor signal amplifier shown in FIG. 4.

The trimable resistor 11 can be located in a feed back loop of the operational amplifier (OP) forming the monitor signal amplifier 18, as shown in FIG. 5. In this case, the operational amplifier (OP) is not constructed so as to be a voltage follower.

Figure 6:
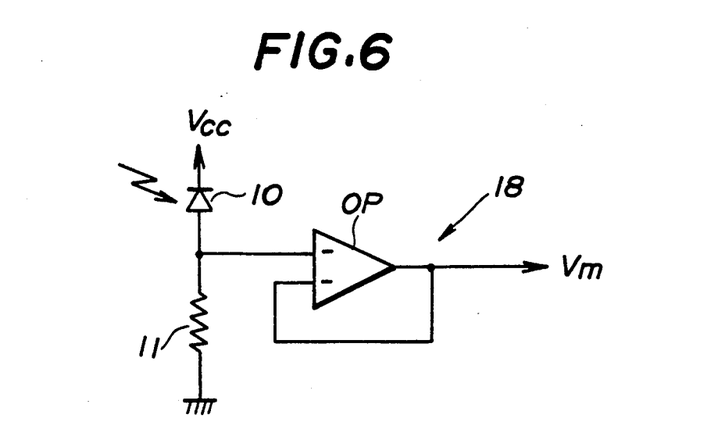

In addition, the operational amplifier (OP), the monitor photodiode 10 and the trimable resistor 11 can also be connected to each other as shown in FIG. 6. That is, the cathode of the monitor photodiode 10 is connected to the power source $V_{cc}$. The trimable resistor 11 is connected between the anode of the monitor photodiode 10 and the ground. The anode of the monitor photodiode 10 and the trimable resistor 11 are respectively connected to an inverting terminal (−) of the operational amplifier (OP).

A description will now be given of a second embodiment of the present invention with reference to FIGS. 8, 9, 10 and 11.

Figure 8:
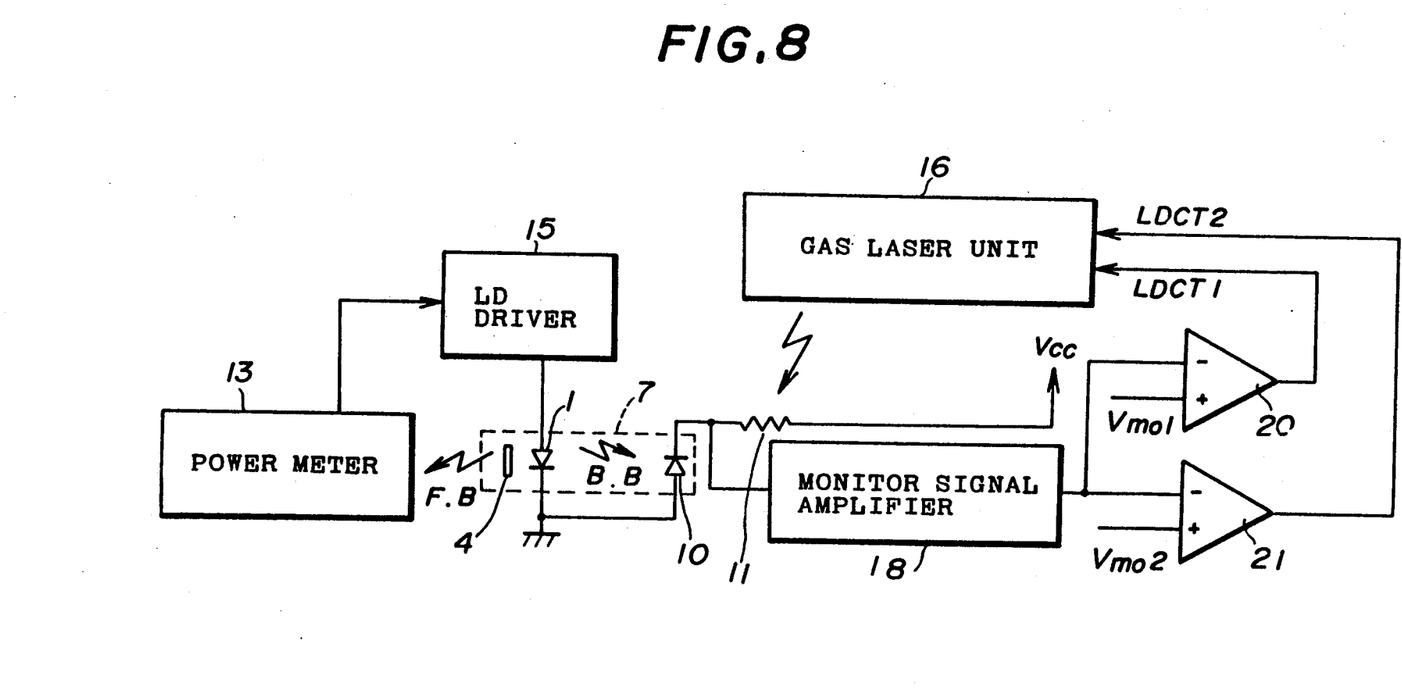
FIG. 8 is a block diagram illustrating a second embodiment of the present invention.

FIG. 8 shows an adjusting system for adjusting the emission power of the semiconductor laser unit according to the second embodiment of the present invention. In FIG. 8, those parts which are the same as those shown in FIG. 4 are given the same reference numbers.

Referring to FIG. 8, a first comparator 20 and a second comparator 21 are substituted for the comparator 14 shown in FIG. 4. The first comparator 20 compares the monitor voltage $V^m$ output from the signal monitor amplifier 18 with a first reference voltage $V_{mol}$ and outputs a first control signal LDCT1. The first control signal LDCT1 becomes active when the monitor voltage $V^m$ is less than or equal to the first reference voltage $V_{oml}$ ($V^m \leq V_{mol}$). The second comparator 21 compares the monitor voltage $V^m$ with a second reference voltage $V_{mo2}$ and outputs a second control signal LDCT2. The second control signal LDCT2 becomes active when the monitor voltage $V^m$ is less than or equal to the second reference voltage $V_{mo2}$ ($V_m \leq V_{mo2}$). The first and second control signals LDCT1 and LDCT 2 are respectively supplied to the gas laser unit 16.

Figure 9:
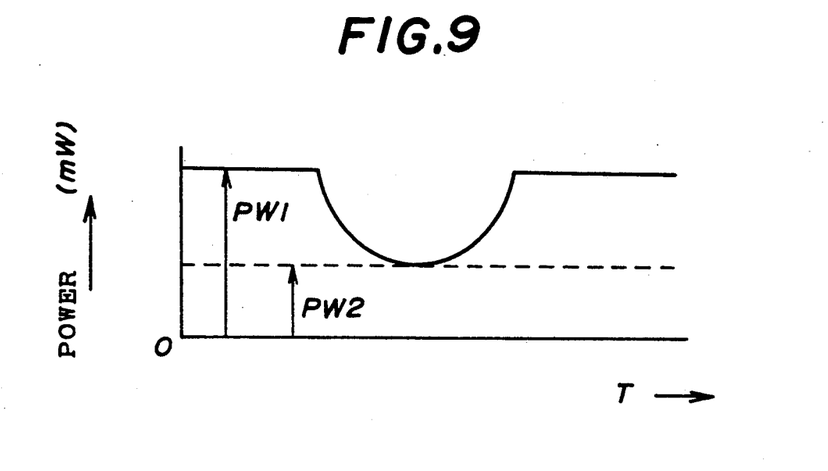
FIG. 9 is a diagram illustrating a characteristic of the emission power of the semiconductor laser unit.

In the laser printer in which the power level of the laser beam is modulated in accordance with image data (the power modulation), the emission power of the semiconductor laser unit 7 is binary controlled between a maximum power level $PW_1$ and a minimum power level $PW_2$, as shown in FIG. 9. A power ratio $PW_2/PW_1$ is a predetermined value less than one. In this case, the first comparator 20 shown in FIG. 8 activates the first control signal LDCT1 when the emission power of the semiconductor laser element 1 is equal to the maximum power level $PW_1$. The second comparator 21 activates the second control signal LDCT2 when the emission power of the semiconductor laser element 1 is equal to the minimum power level $PW_2$.

In a case where the semiconductor laser unit 7 optically writes an image on the surface of the photosensitive drum, the first control signal LDCT1 output from the first comparator 20 and the second control signal LDCT2 output from the second comparator 21 are respectively supplied to the LD driving circuit 15. Then the LD driving circuit 15 controls the driving current of the semiconductor laser element 1 based on the first and second control signals LDCT1 and LDCT2 so that the emission power of the semiconductor laser element 1 becomes equal to the maximum power level $PW_1$ or the minimum power level $PW_2$.

On the other hand, the emission power adjustment of the semiconductor laser unit 7 is carried out in accordance with the following procedure.

The LD driving circuit 15 drives the semiconductor laser element 1, and then the front beam (FB) emitted from the semiconductor laser element 1 is incident on the power meter 13 set on the surface of the photosensitive drum. In a condition where the emission power indicated by the power meter 13 is equal to the minimum power level $PW_2$, the gas laser unit 16 emits the laser beam until the monitor voltage $V^m$ becomes equal to the second reference voltage $V_{mo2}$ and the second comparator 21 activates the second control signal LDCT2. At this time, a first trimming of the trimable resistor 11 is carried out by the laser beam emitted form the gas laser unit 16. Next, in a condition where the emission power indicated by the power meter 13 becomes equal to the maximum power level $PW_1$, the gas laser unit 16 emits the laser beam until the monitor voltage $V^m$ becomes equal to the first reference voltage $V_{mol}$ and the first comparator 20 activates the first control signal LDCT1. At this time, a second trimming of the trimable resistor 11 is carried out by the laser beam emitted from the gas laser until 16.

Due to the above first and second trimming of the trimable resistor 11, a trimmed line having an L shape is formed on the resistance layer of the trimable resistor 11, as will be described later. Thus, the input resistance of the operational amplifier (OP) is adjusted, so that the gain of the monitor signal amplifier 18 is adjusted.

Figure 10:
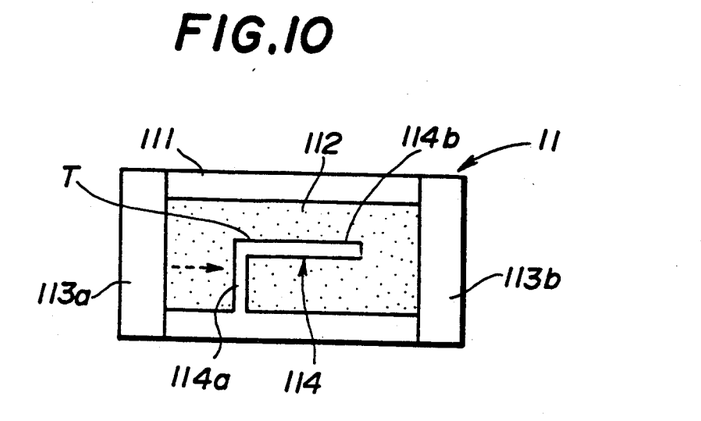
FIG. 10 is a plan view illustrating a trimable resistor on which an L shaped trimming is carried out.

The trimable resistor 11 is formed as shown in FIG. 10. That is, a resistance layer 112 having a band shape is provided on a substrate 111 which is formed of alumina. A first electrode 113a is formed on the substrate 111 so as to be in contact with a first end of the resistance layer 112. A second electrode 113b is formed on the substrate 111 so as to be in contact with a second end of the resistance layer 112. The trimable resistor 11 is connected to the operational amplifier (OP) so that a current flows in the resistance layer 112 from the first electrode 113a toward the second electrode 113b, as indicated by an arrow formed of dashes.

When the above first trimming is carried out, a first trimmed line 114a is formed on the resistance layer 112 in a direction perpendicular to a current flow direction indicated by the arrow. Then, the direction of the trimming is changed by 90° at a time that the second control signal LDCT2 is activated. In FIG. 10, the point at which the direction of the trimming is changed is indicated by T. After this changing in the direction, the above second trimming is carried out. When the second trimming is carried out, a second trimmed line 114b is formed on the resistance layer 112 in a direction parallel to the current flow direction. Thus, the trimmed line 114 formed of the first and second trimmed lines 114a and 114b has the L shape.

The general procedure of the trimming in which the L shaped trimmed line is formed on the resistance layer is disclosed, for example, in Japanese Patent Laid Open Publication Nos. 52-117087 and 1-226123.

Figure 11:
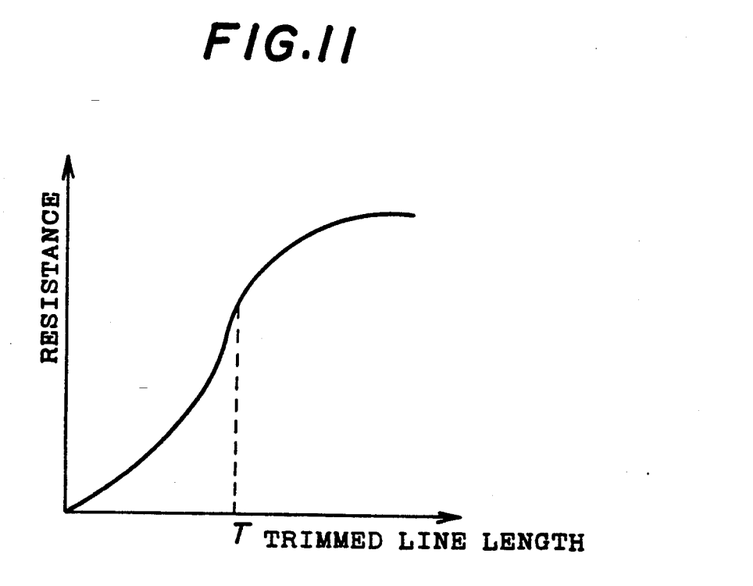
FIG. 11 is a graph resistance against length of trimmed line.

While the first trimmed line 144a is being formed in the direction perpendicular to the current flow direction on the resistance layer 112, a cross section of the resistance layer 112 along the first trimmed line 114a continuously decreases. On the other hand, while the second trimmed line 144b is being formed in the direction parallel to the current flow direction on the resistance layer 112, a cross section of the resistance layer 112 in a direction perpendicular to the current flow direction hardly decreases. Thus, the resistance value of the trimable resistor 11 rapidly changes while the first trimmed line 144a is being formed, and that of trimable resistor 11 slowly changes while the second * trimmed line 144b is being formed, as shown in FIG. 11. That is, the resistance value is roughly adjusted while the first trimmed line 144a is being formed up to the point T, then the resistance value is finely adjusted while the second trimmed line is being formed starting from the point T.

In the above second embodiment, when the emission power of the semiconductor laser unit 7 is equal to the minimum power level $PW_2$, the first trimmed line 144a is formed so that the resistance value is roughly adjusted. When the emission power of the semiconductor laser unit 7 is equal to the maximum power level $PW_1$, the second trimmed line 114b is formed so that the resistance value is finely adjusted. Hence, a timing at which a direction of the trimming is changed can be easily determined, and the gain of the monitor signal amplifier can be adjusted accurately.

The present invention is not limited to the aforementioned embodiment, and variations and modifications thereto may be made without departing from the scope of the claimed invention.

What is claimed is:

1. An output control apparatus for controlling emission power of a laser unit which emits a laser beam, said emission power corresponding to an amount of light in the laser beam emitted by said laser unit, said output control apparatus comprising:
    monitor means, coupled to said laser unit, for generating a first monitor signal corresponding to the emission power of the laser unit;
    signal processing means, coupled to said monitor means, for amplifying the first monitor signal and for outputting a second monitor signal, said signal processing means having a trimable resistor for adjusting a gain of said signal processing means, a resistance value of said trimable resistor being changed by a trimming thereof; and
    control means, coupled to said laser unit and said signal processing means, for controlling the emission power of said laser unit based on the second monitor means so that the emission power of said laser unit is maintained at a predetermined power level.

2. An output control apparatus as claimed in claim 1, wherein said signal processing means comprises an operational amplifier, the first monitor signal being supplied to an input terminal of said operational amplifier, the second monitor signal being output from an output terminal of said operational amplifier, and said trimable resistor being connected between the input terminal and the output terminal so that the trimable resistor is used as a feed back resistor of said operational amplifier.

3. An output control apparatus as claimed in claim 1, wherein said signal processing means comprises an operational amplifier which is constructed so as to be a voltage follower, the first monitor signal being supplied to an input terminal of said operational amplifier, the second monitor signal being output from an output terminal of said operational amplifier, and said trimable resistor being connected to the input terminal so as to be an input resistor of said operational amplifier.

4. A method for adjusting an output control apparatus for controlling emission power of a laser unit which emits a laser beam, said emission power corresponding to an amount of light in the laser beam emitted by said laser unit, said output control apparatus comprising:
    monitor means for generating a first monitor signal corresponding to the emission power of the laser unit;
    signal processing means for amplifying the first monitor signal and for outputting a second monitor signal, said signal processing means having a trimable resistor for adjusting a gain of said signal processing means, a resistance value of said trimable resistor being changed by a trimming thereof; and
    control means for controlling the emission power of said laser unit based on the second monitor means so that the emission power of said laser unit is maintained at a predetermined power level, said method comprising the following steps (a) and (b) of:
    (a) maintaining the emission power of said laser unit at a predetermined power level; and
    (b) carrying out a trimming of said trimable resistor so that the second monitor signal output from the signal processing means becomes a predetermined value while said step (a) is being carried out,
    whereby the gain of said signal processing means is adjusted so that the emission power having the predetermined power level is obtained when the second monitor signal output from said signal processing means is equal to the predetermined value.

5. A method as claimed in claim 4, wherein said step (a) comprises the following steps (a1) and (a2) of:
    (a1) maintaining the emission power of said laser unit at a first power level; and
    (a2) maintaining the emission power of said laser unit at a second power level greater than the first power level; and
    said step (b) comprises the following steps (b1) and (b2) of:
    (b1) carrying out a first trimming until the second monitor signal becomes a first value while said step (a1) is being carried out, so that a first trimmed line is formed on said trimable resistor; and
    (b2) carrying out a second trimming until the second monitor signal becomes a second value while said step (a2) is being carried out, so that a second trimmed line is formed on said trimable resistor,
    wherein a length of the first trimmed line in a direction perpendicular to a current flow direction is greater than a length of the second trimmed line in a direction perpendicular to the current flow direction, said current flow direction being a direction in which a current flows in said trimable resistor.

6. A method as claimed in claim 5, wherein the first trimmed line is formed in a direction perpendicular to the current flow direction in said step (b1), and the second trimmed line is formed in a direction parallel to the current flow direction in said step (b2).

* * * * *